(12) United States Patent
Nakagawa et al.

(10) Patent No.: US 10,578,935 B2
(45) Date of Patent: Mar. 3, 2020

(54) LIQUID CRYSTAL DISPLAY DEVICE COMPRISING FIRST AND SECOND LIQUID CRYSTAL LAYERS AND A FIRST LIGHT SHIELDING UNIT HAVING A FIRST PORTION AND A SECOND PORTION

(71) Applicant: Panasonic Liquid Crystal Display Co., Ltd., Himeji-shi, Hyogo (JP)

(72) Inventors: Teruhisa Nakagawa, Hyogo (JP); Daisuke Kajita, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 15/915,767

(22) Filed: Mar. 8, 2018

(65) Prior Publication Data

US 2018/0259818 A1    Sep. 13, 2018

(30) Foreign Application Priority Data

Mar. 9, 2017   (JP) ................................ 2017-044783

(51) Int. Cl.
| | |
|---|---|
| *G02F 1/1362* | (2006.01) |
| *G02F 1/1335* | (2006.01) |
| *G02F 1/1347* | (2006.01) |
| *G02F 1/1343* | (2006.01) |

(52) U.S. Cl.
CPC ...... *G02F 1/136209* (2013.01); *G02F 1/1347* (2013.01); *G02F 1/13471* (2013.01); *G02F 1/133512* (2013.01); *G02F 1/136286* (2013.01); *G02F 2001/133562* (2013.01); *G02F 2001/133567* (2013.01); *G02F 2001/134372* (2013.01); *G02F 2201/121* (2013.01); *G02F 2202/28* (2013.01)

(58) Field of Classification Search
CPC ............... G02F 1/1347; G02F 2202/52; G02F 1/13471; G02F 2001/133562; G02F 2001/133601; G02F 2001/133567
See application file for complete search history.

(56) References Cited

U.S. PATENT DOCUMENTS

| | | | | |
|---|---|---|---|---|
| 2004/0141130 | A1* | 7/2004 | Kawata | ............. G02F 1/136209 349/139 |
| 2005/0140858 | A1* | 6/2005 | Park | .................... G02F 1/13394 349/110 |
| 2006/0227273 | A1* | 10/2006 | Shin | .................... G02F 1/13624 349/139 |

(Continued)

FOREIGN PATENT DOCUMENTS

| | | | |
|---|---|---|---|
| JP | 2001222030 A | * | 8/2001 |
| WO | 2007/040127 | | 4/2007 |

*Primary Examiner* — Paul C Lee
(74) *Attorney, Agent, or Firm* — Hamre, Schumann, Mueller & Larson, P.C.

(57) ABSTRACT

A display device includes a first substrate formed with a first gate line, a first source line, a first thin film transistor, and a first light shielding unit; a second substrate disposed opposite to the first substrate; and a first liquid crystal layer disposed between the first substrate and the second substrate. The first light shielding unit is disposed between the first thin film transistor and the first liquid crystal layer, and overlaps at least a part of a first channel region of the first thin film transistor in planar view.

8 Claims, 17 Drawing Sheets

(56) References Cited

U.S. PATENT DOCUMENTS

| | | | |
|---|---|---|---|
| 2008/0017885 A1* | 1/2008 | Ishii | G02F 1/136209 |
| | | | 257/203 |
| 2008/0186423 A1* | 8/2008 | Ishii | G02F 1/136209 |
| | | | 349/46 |
| 2009/0033819 A1* | 2/2009 | Nakagawa | G02F 1/13454 |
| | | | 349/44 |
| 2009/0147186 A1 | 6/2009 | Nakai et al. | |
| 2011/0261268 A1 | 10/2011 | Nakai et al. | |
| 2015/0009426 A1* | 1/2015 | Lee | G02F 1/13338 |
| | | | 349/12 |
| 2016/0216554 A1* | 7/2016 | Lee | G02F 1/133514 |

* cited by examiner

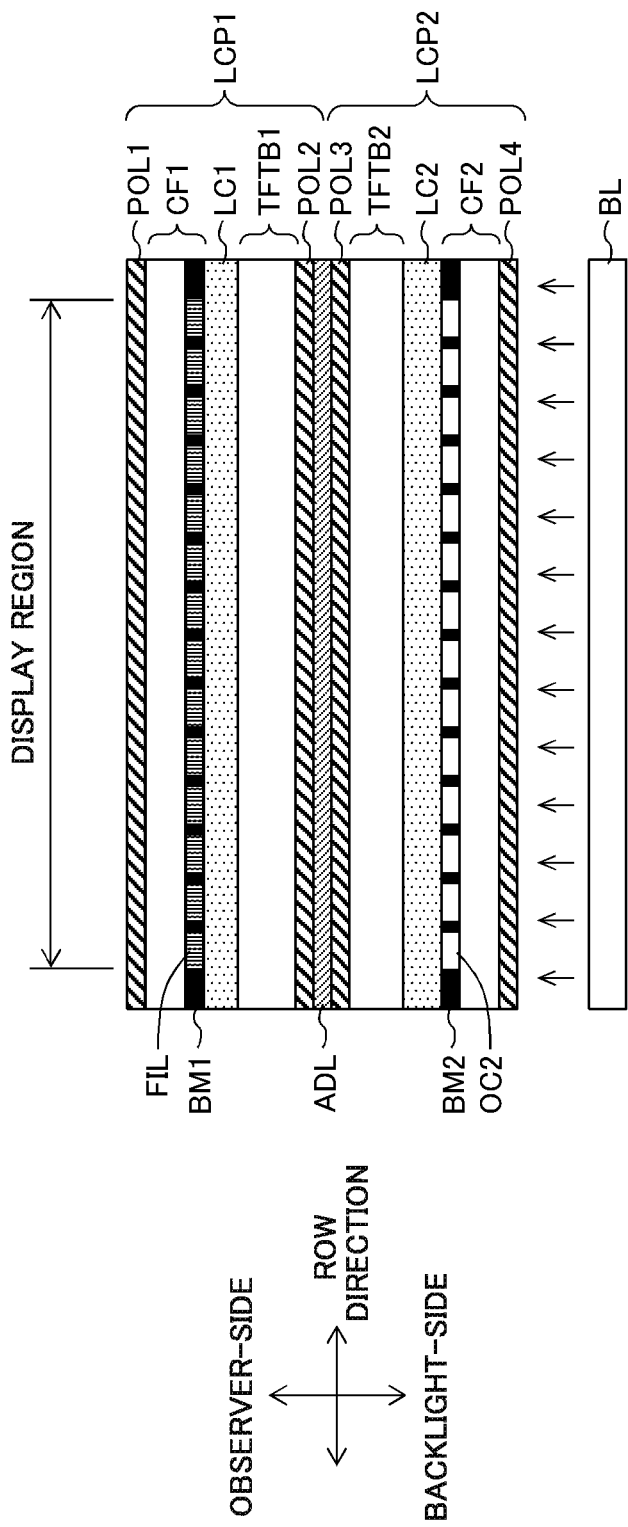

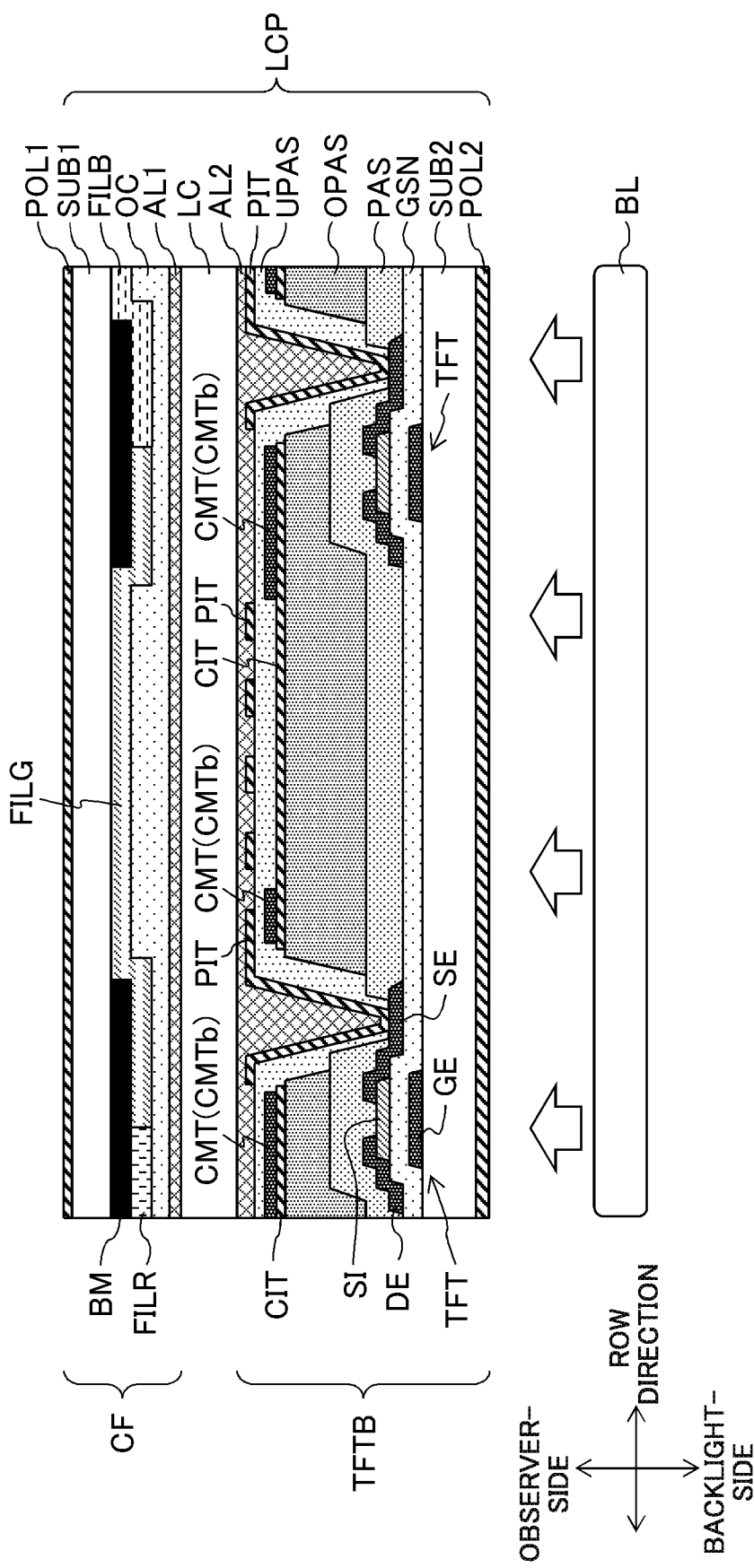

LIQUID CRYSTAL DISPLAY DEVICE COMPRISING FIRST AND SECOND LIQUID CRYSTAL LAYERS AND A FIRST LIGHT SHIELDING UNIT HAVING A FIRST PORTION AND A SECOND PORTION

CROSS-REFERENCE TO RELATED APPLICATION

The present application claims priority from Japanese application JP 2017-044783 filed on Mar. 9, 2017, the contents of which are hereby incorporated by reference into this application.

TECHNICAL FIELD

The present invention relates to a liquid crystal display device, and, more particularly to a liquid crystal display device with improved contrast.

BACKGROUND

In a liquid crystal display device, when light from a backlight, light from an outside (natural light), or light in which the light from the backlight and the natural light is scattered by a liquid crystal layer (scattered light) is incident on a channel region of a thin film transistor, a characteristic of the thin film transistor generally changes, which results in degradation of display quality. For example, a method for enlarging a region of a black matrix or a method for providing a light shielding layer on a backlight side of the thin film transistor is conceivable as a method for solving the problem. However, in these methods, an opening ratio of a pixel is degraded, or a configuration becomes complicated.

A technique, in which two display panels overlap each other and an image is displayed on each display panel based on an input video signal, is conventionally proposed to improve contrast of a liquid crystal display device (for example, see International Publication WO2007/040127). Specifically, for example, a color image is displayed on a front-side (observer-side) display panel in two display panels disposed back and forth, and a black-and-white image is displayed on a rear-side (backlight-side) display panel, thereby improving contrast. In a liquid crystal display device including two display panels, the display panel disposed on the backlight side is easily influenced by the back light or the scattered light, and the characteristic of the thin film transistor is easy to change.

Thus, in the conventional liquid crystal display device, the display quality is degraded due to the light incident on the channel region of the thin film transistor.

The present disclosure is made in view of the above situation, and an object of the present disclosure is to provide a liquid crystal display device that can prevent the degradation of the display quality due to the light incident on the channel region of the thin film transistor.

SUMMARY

In one general aspect, a display device of the instant application includes a first substrate formed with a first gate line, a first source line, a first thin film transistor, and a first light shielding unit; a second substrate disposed opposite to the first substrate; and a first liquid crystal layer disposed between the first substrate and the second substrate. The first light shielding unit is disposed between the first thin film transistor and the first liquid crystal layer, and overlaps at least a part of a first channel region of the first thin film transistor in planar view.

The above general aspect may include one or more of the following features.

A common electrode may be further formed on the first substrate. The first light shielding unit may be made of a metallic material, and electrically connected to the common electrode.

A common wiring through which a common voltage is supplied to the common electrode may be further formed on the first substrate. The first light shielding unit may be integral with the common wiring.

An organic insulator film may be further formed on the first substrate, and the organic insulator film may be disposed between the first thin film transistor and the first light shielding unit.

The liquid crystal display device may further include a backlight. The first liquid crystal layer may be disposed between the backlight and the first substrate.

The second substrate may include a black matrix. The black matrix may overlap at least a part of the first channel region in planar view, and the first light shielding unit may include an overlapping region where the first light shielding unit overlaps the black matrix and a non-overlapping region where the first light shielding unit does not overlap the black matrix.

The liquid crystal display device may further include a third substrate formed with a second gate line, a second source line, and a second thin film transistor; a fourth substrate disposed opposite to the third substrate; and a second liquid crystal layer disposed between the third substrate and the fourth substrate. The second substrate may be disposed between the first liquid crystal layer and the second liquid crystal layer.

The liquid crystal display device may further include a backlight. The first liquid crystal layer may be disposed between the backlight and the second substrate.

The liquid crystal display device may further include: a third substrate formed with a second gate line, a second source line, and a second thin film transistor; a fourth substrate disposed opposite to the third substrate; and a second liquid crystal layer disposed between the third substrate and the fourth substrate. The first substrate may be disposed between the first liquid crystal layer and the second liquid crystal layer.

The liquid crystal display device may further include a backlight. The first liquid crystal layer may be disposed between the backlight and the first substrate.

A second light shielding unit may be further formed on the third substrate, and the second light shielding unit may be disposed between the second thin film transistor and the second liquid crystal layer, and may overlap at least a part of a second channel region of the second thin film transistor in planar view.

In the liquid crystal display device of the present disclosure, the degradation of the display quality due to the light incident on the channel region of the thin film transistor can be prevented.

BRIEF DESCRIPTION OF THE DRAWINGS

FIG. 5 is a sectional view taken along line A-A in FIGS. 3 and 4;

FIG. 15 is a sectional view illustrating a configuration of pixel of display panel LCP of the second exemplary embodiment;

DETAILED DESCRIPTION

Hereinafter, an exemplary embodiment of the present disclosure will be described with reference to the drawings. A liquid crystal display device according to one exemplary embodiment includes a plurality of display panels that display images, a plurality of driving circuits (a plurality of source drivers and a plurality of gate drivers) that drive the display panels, a plurality of timing controllers that control the driving circuits, an image processor that performs image processing on an input video signal input from an outside and outputs image data to each of the timing controllers, and a backlight that irradiates the plurality of display panels with light from a rear surface side. A number of the plurality of display panels is not limited to two, and may be more When viewed from the observer side, the plurality of display panels are disposed while overlapping each other in a front-back direction. An image is displayed on each of the display panels. A liquid crystal display device LCD of a first exemplary embodiment including two display panels will be described below by way of example, and a liquid crystal display device LCD of a second exemplary embodiment including a one display panels will be described below by way of example.

First Exemplary Embodiment

Figure 1:
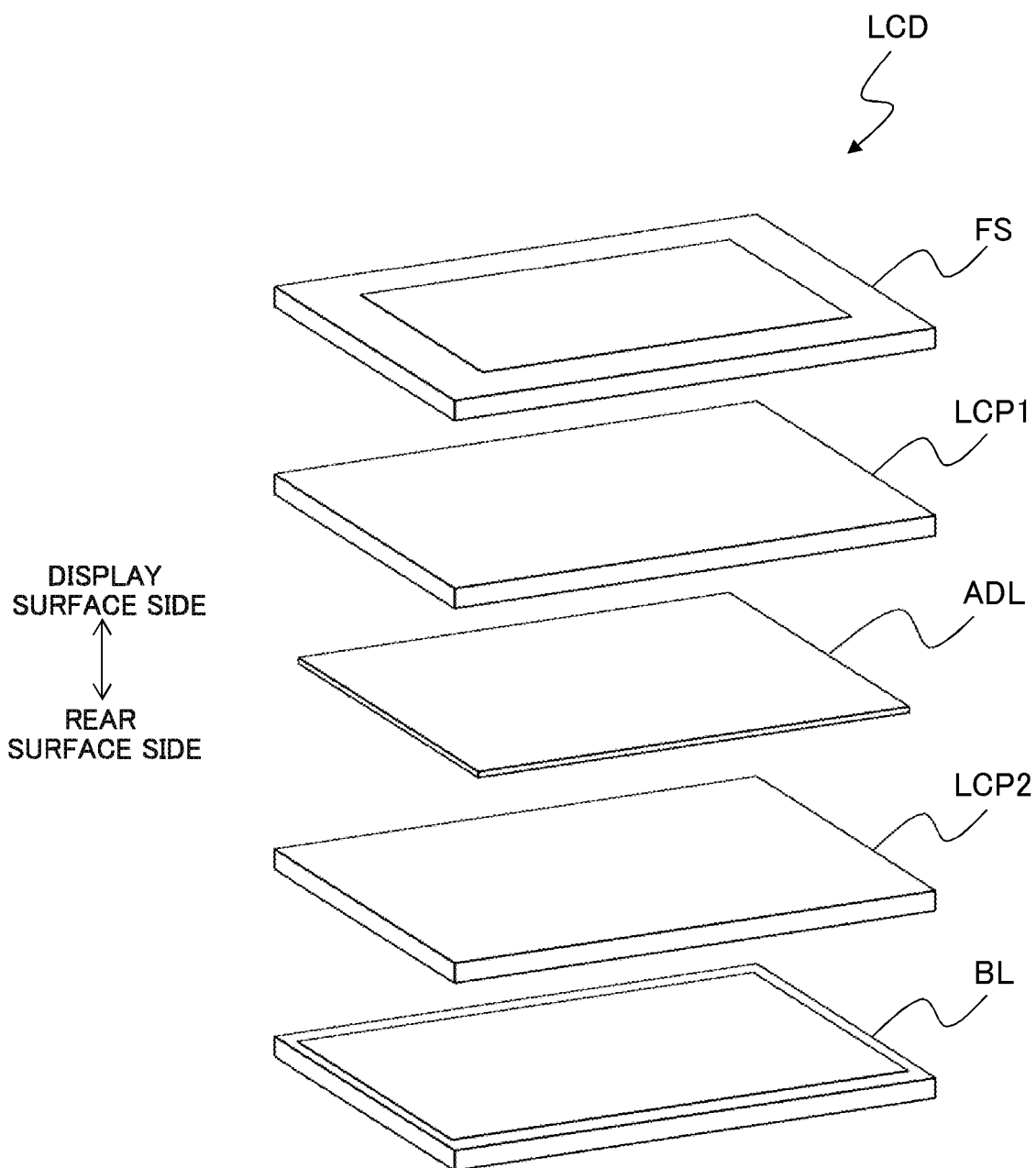
FIG. 1 is a perspective view illustrating a schematic configuration of liquid crystal display device of a first exemplary embodiment.

FIG. 1 is a perspective view illustrating a schematic configuration of liquid crystal display device LCD of the exemplary embodiment. As illustrated in FIG. 1, liquid crystal display device LCD includes display panel LCP1 disposed at a position (front side) closer to an observer, display panel LCP2 disposed at a position (rear side) farther away from the observer with respect to display panel LCP1, adhesive layer ADL in which display panel LCP1 and display panel LCP2 adhere to each other, backlight BL disposed on the rear surface side of display panel LCP2, and front chassis FS that covers display panel LCP1 and display panel LCP2 from the display surface side.

Figure 2:
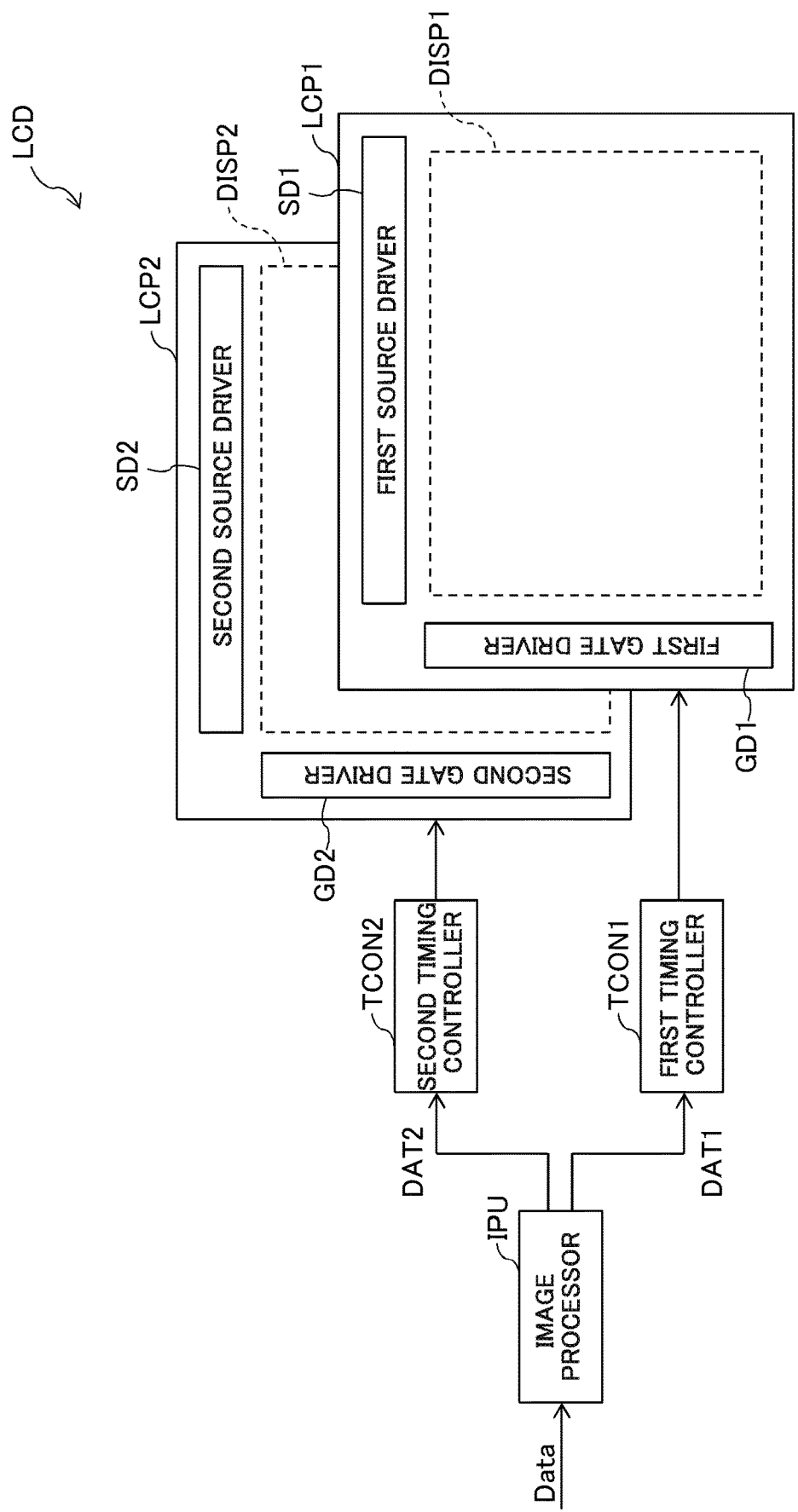
FIG. 2 is a view illustrating a schematic configuration of liquid crystal display device of the first exemplary embodiment.

FIG. 2 is a view illustrating the schematic configuration of liquid crystal display device LCD of the exemplary embodiment. As illustrated in FIG. 2, display panel LCP1 includes first source driver SD1 and first gate driver GD1, and display panel LCP2 includes second source driver SD2 and second gate driver GD2. Liquid crystal display device LCD also includes first timing controller TCON1 that controls first source driver SD1 and first gate driver GD1, second timing controller TCON2 that controls second source driver SD2 and second gate driver GD2, and image processor IPU that outputs image data to first timing controller TCON1 and second timing controller TCON2. For example, display panel LCP1 displays a color image in first image display region DISP1 according to the input video signal, and display panel LCP2 displays a black-and-white image in second image display region DISP2 according to the input video signal. Image processor IPU receives input video signal Data transmitted from an external system (not illustrated), performs known image processing on input video signal Data, and then outputs first image data DAT1 to first timing controller TCON1 and outputs second image data DAT2 to second timing controller TCON2. Image processor IPU also outputs a control signal (not illustrated in FIG. 2) such as a synchronizing signal to first timing controller TCON1 and second timing controller TCON2. For example, first image data DAT1 is image data for displaying the color image, and second image data DAT2 is image data for displaying the monochrome image.

Figure 3:
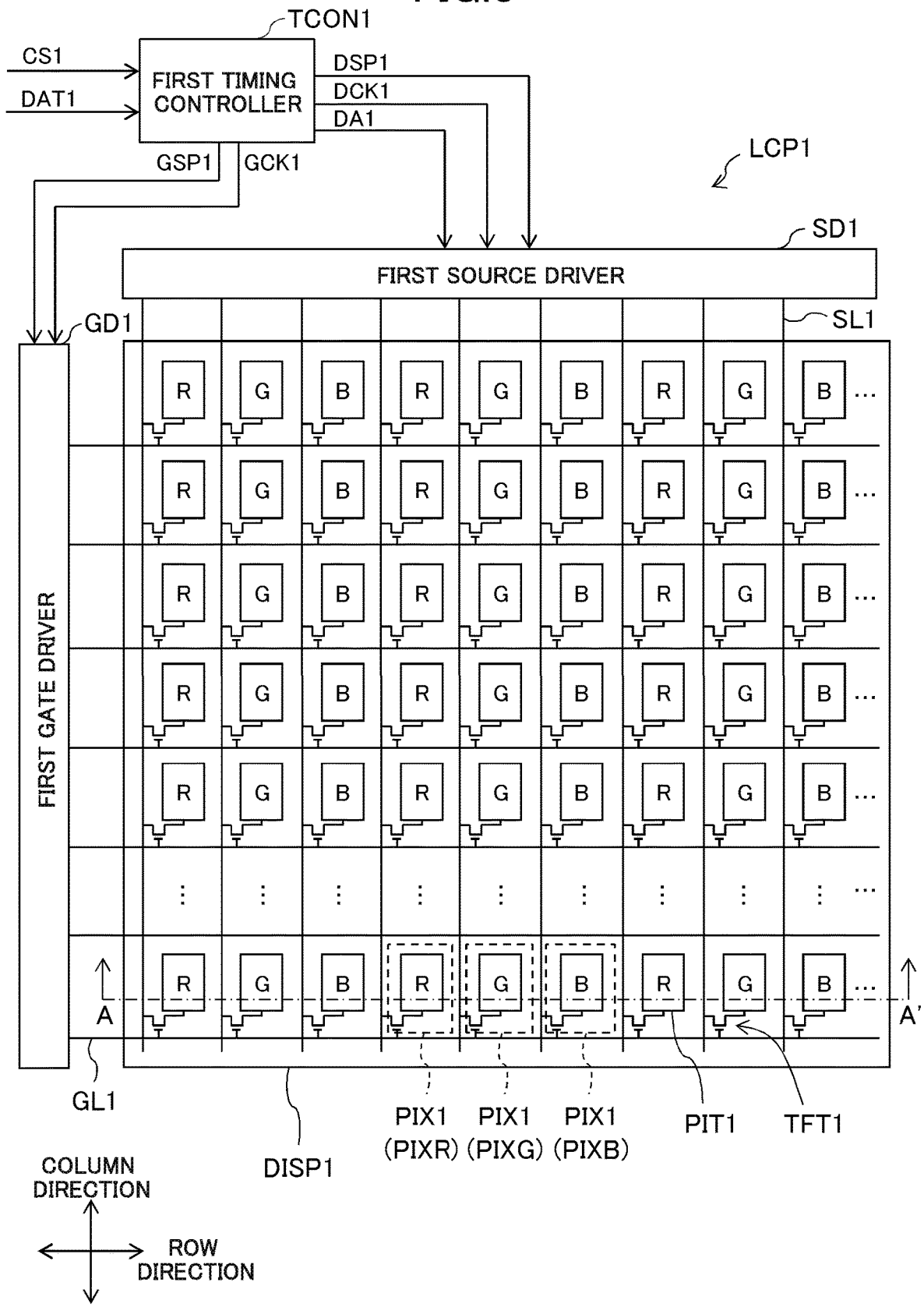
FIG. 3 is a plan view illustrating a schematic configuration of display panel LCP1 of the first exemplary embodiment.
Figure 4:
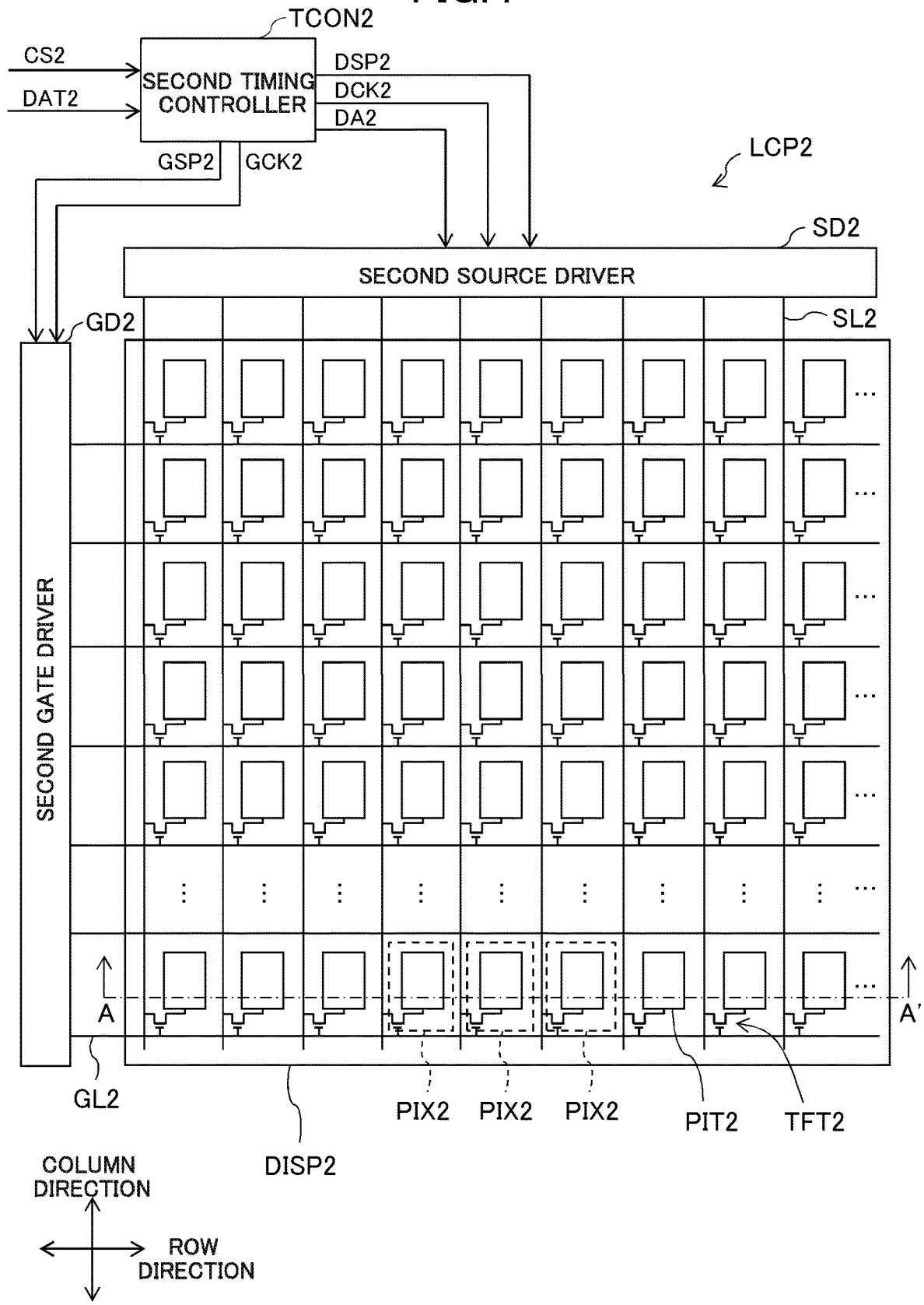
FIG. 4 is a plan view illustrating a schematic configuration of display panel LCP2 of the first exemplary embodiment.

FIG. 3 is a plan view illustrating a schematic configuration of display panel LCP1 of the first exemplary embodiment, and FIG. 4 is a plan view illustrating a schematic configuration of display panel LCP2 of the first exemplary embodiment. FIG. 5 is a sectional view taken along line A-A in FIGS. 3 and 4.

The schematic configuration of display panel LCP1 will be described with reference to FIGS. 3 and 5. As illustrated in FIG. 5, display panel LCP1 includes thin film transistor substrate TFTB1 disposed on the side of backlight BL, counter substrate CF1, which is disposed on the observer side while being opposite to thin film transistor substrate TFTB1, and liquid crystal layer LC1 disposed between thin film transistor substrate TFTB1 and counter substrate CF1. Polarizing plate POL2 is disposed on the side of backlight BL of display panel LCP1, and polarizing plate POL1 is disposed on the observer side.

In thin film transistor substrate TFTB1, as illustrated in FIG. 3, a plurality of source lines SL1 extending in a first direction (for example, a column direction), and a plurality of gate lines GL1 extending in a second direction (for example, a row direction) different from the first direction are formed, and thin film transistor TFT1 is formed close to an intersection between each of the plurality of source lines SL1 and each of the plurality of gate lines GL1. In plan view of display panel LCP1, a region surrounded by two source lines SL1 adjacent to each other and two gate lines GL1 adjacent to each other is defined as one pixel PIX1, and a plurality of pixels PIX1 are disposed in a matrix form (the row direction and the column direction). The plurality of source lines SL1 are disposed at equal intervals in the row direction, and the plurality of gate lines GL1 are disposed at equal intervals in the column direction. In thin film transistor substrate TFTB1, pixel electrode PIT1 is formed in each pixel PIX1, and one common electrode CIT1 (see FIG. 14) common to the plurality of pixels PIX1 is formed. Drain electrode DE1 (see FIG. 14) constituting thin film transistor TFT1 is electrically connected to source line SL1, source electrode SE1 (see FIG. 14) is electrically connected to pixel electrode PIT1 through contact hole CH1 (see FIG. 14), and gate electrode GE1 (see FIG. 14) is electrically connected to gate line GL1.

As illustrated in FIG. 5, a light transmission unit that transmits light and black matrix BM1 (a light shielding unit) that obstructs the light transmission are formed in counter substrate CF1. A plurality of color filters FIL (colored layer) are formed in the light transmission unit according to each pixel PIX1. The light transmission unit is surrounded by black matrix BM. For example, the light transmission unit is formed into a rectangular shape. The plurality of color filters FIL include red color filters FILR (red layer) made of a red (R color) material to transmit red light, green color filters FILG (green layer) made of a green (G color) material to transmit green light, and blue color filters FILB (blue layer) made of a blue (B color) material to transmit blue light. Red color filters FILR, green color filters FILG, and blue color filters FILB are repeatedly arrayed in the row direction in this order, identical-color filters FIL are arrayed in the column direction, and black matrix BM1 is formed at a boundary between color filters FIL adjacent to each other in the row direction and the column direction. According to each color filter FIL, as illustrated in FIG. 3, the plurality of pixels PIX1 include red pixels PIXR corresponding to red color filter FILR, green pixels PIXG corresponding to green color filter FILG, and blue pixels PIXB corresponding to blue color filter FILB. In display panel LCP1, red pixels PIXR, green pixels PIXG, and blue pixels PIXB are repeatedly arrayed in the row direction in this order, and pixels PIX1 having the identical color are arrayed in the column direction.

First timing controller TCON1 has a known configuration. For example, based on first image data DAT1 and first control signal CS1 (such as a clock signal, a vertical synchronizing signal, and a horizontal synchronizing signal), which are output from image processor IPU, first timing controller TCON1 generates various timing signals (data start pulse DSP1, data clock DCK1, gate start pulse GSP1, and gate clock GCK1) to control first image data DA1 and drive of first source driver SD1 and first gate driver GD1 (see FIG. 3). First timing controller TCON1 outputs first image data DA1, data start pulse DSP1, and data clock DCK1 to first source driver SD1, and outputs gate start pulse GSP1 and gate clock GCK1 to first gate driver GD1.

First source driver SD1 outputs a data signal (data voltage) corresponding to first image data DA1 to source line SL1 based on data start pulse DSP1 and data clock DCK1. First gate driver GD1 outputs a gate signal (gate voltage) to gate lines GL1 based on gate start pulse GSP1 and gate clock GCK1.

First source driver SD1 supplies the data voltage to each source line SL1, and first gate driver GD1 supplies the gate voltage to each gate line GL1. Common voltage Vcom is supplied from a common driver (not illustrated) to common electrode CIT1 through a common wiring CMT1 (see FIG. 6). When the gate voltage (gate-on voltage) is supplied to gate line GL1, thin film transistor TFT1 connected to gate line GL1 is turned on, and the data voltage is supplied to pixel electrode PIT1 through source line SL1 connected to thin film transistor TFT1. An electric field is generated by a difference between the data voltage supplied to pixel electrode PIT1 and common voltage Vcom supplied to common electrode CIT1. The liquid crystal is driven by the electric field, and transmittance of the light emitted from backlight BL is controlled, thereby displaying an image. In display panel LCP1, a color image is displayed by the supply of a desired data voltage to source line SL1 connected to pixel electrode PIT1 of each of pixel PIX1.

The configuration of display panel LCP2 will be described below with reference to FIGS. 4 and 5. As illustrated in FIG. 5, display panel LCP2 includes thin film transistor substrate TFTB2 disposed on the side of backlight BL, counter substrate CF2, which is disposed on the observer side while being opposite to thin film transistor substrate TFTB2, and liquid crystal layer LC2 disposed between thin film transistor substrate TFTB2 and counter substrate CF2. Polarizing plate POL4 is disposed on the side of backlight BL of display panel LCP2, and polarizing plate POL3 is disposed on the observer side. Adhesive layer ADL is disposed between polarizing plate POL2 of display panel LCP1 and polarizing plate POL3 of display panel LCP2.

In thin film transistor substrate TFTB2, as illustrated in FIG. 4, a plurality of source lines SL2 extending in the column direction, and a plurality of gate lines GL2 extending in the row direction are formed, and thin film transistor TFT2 is formed close to the intersection between each of the plurality of source lines SL2 and each of the plurality of gate lines GL2. In plan view of display panel LCP2, a region surrounded by two source lines SL2 adjacent to each other and two gate lines GL2 adjacent to each other is defined as one pixel PIX2, and a plurality of pixels PIX2 are disposed in a matrix form (the row direction and the column direction). The plurality of source lines SL2 are disposed at equal intervals in the row direction, and the plurality of gate lines GL2 are disposed at equal intervals in the column direction. In thin film transistor substrate TFTB2, pixel electrode PIT2 is formed in each pixel PIX2, and one common electrode CIT2 (see FIG. 14) common to the plurality of pixels PIX2 is formed. Drain electrode DE2 constituting thin film transistor TFT2 is electrically connected to source line SL2, source electrode SE2 (see FIG. 14) is electrically connected to pixel electrode PIT2 through contact hole CH2 (see FIG. 14), and gate electrode GE2 (see FIG. 14) is electrically connected to gate line GL2.

In counter substrate CF2 (See FIG. 5), the light transmission unit that transmits light is formed. The color filter (colored portion) is not formed in the light transmission unit, but overcoat film OC2 is formed in the light transmission unit.

Second timing controller TCON2 has a known configuration. For example, based on second image data DAT2 and second control signal CS2 (such as a clock signal, a vertical synchronizing signal, and a horizontal synchronizing signal), which are output from image processor IPU, second timing controller TCON2 generates various timing signals (data start pulse DSP2, data clock DCK2, gate start pulse GSP2, and gate clock GCK2) to control second image data DA2 and drive of second source driver SD2 and second gate driver GD2 (see FIG. 4). Second timing controller TCON2 outputs second image data DA2, data start pulse DSP2, and data clock DCK2 to second source driver SD2, and outputs gate start pulse GSP2 and gate clock GCK2 to second gate driver GD2.

Second source driver SD2 outputs the data voltage corresponding to second image data DA2 to source line SL2 based on data start pulse DSP2 and data clock DCK2. Second gate driver GD2 outputs the gate voltage to gate lines GL2 based on gate start pulse GSP2 and gate clock GCK2.

Second source driver SD2 supplies the data voltage to each source line SL2, and second gate driver GD2 supplies the gate voltage to each gate line GL2. The common driver supplies common voltage Vcom to common electrode CIT2 through a common wiring CMT1 (see FIG. 6). When the gate voltage (gate-on voltage) is supplied to gate line GL2, thin film transistor TFT2 connected to gate line GL2 is turned on, and the data voltage is supplied to pixel electrode PIT2 through source line SL2 connected to thin film transistor TFT2. An electric field is generated by a difference between the data voltage supplied to pixel electrode PIT2 and common voltage Vcom supplied to common electrode CIT2. The liquid crystal is driven by the electric field, and transmittance of the light emitted from backlight BL is controlled, thereby displaying an image. In display panel LCP2, a color image is displayed by the supply of a desired data voltage to source line SL1 connected to pixel electrode PIT1 of each of red pixel PIXR, green pixel PIXG, and blue pixel PIXB.

Figure 6A:
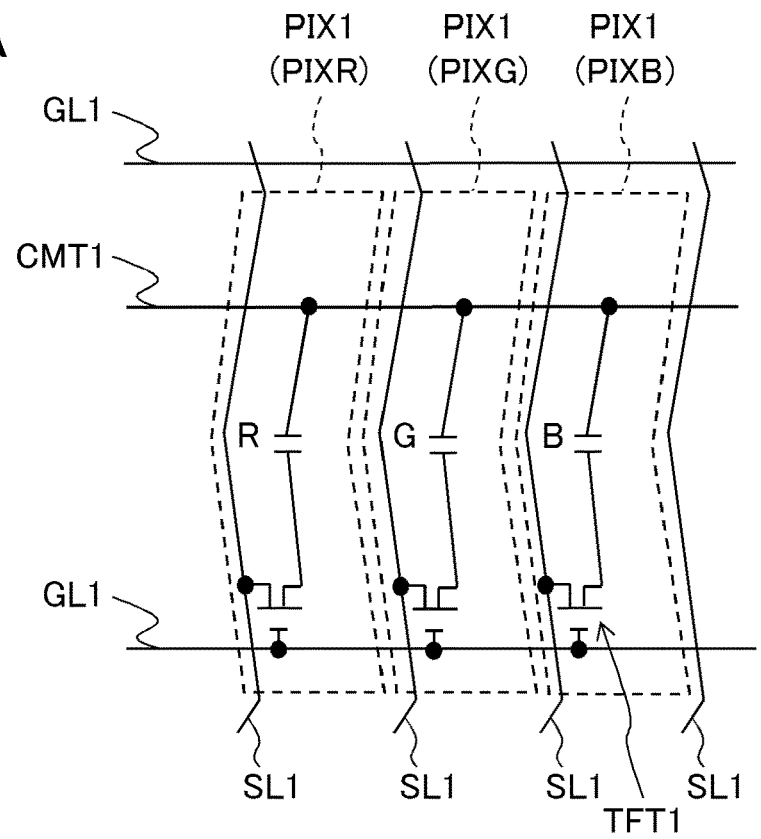
FIGS. 6A and 6B are plan views each illustrating a disposition relationship between pixel of display panel LCP1 and pixel of display panel LCP2.
Figure 6B:
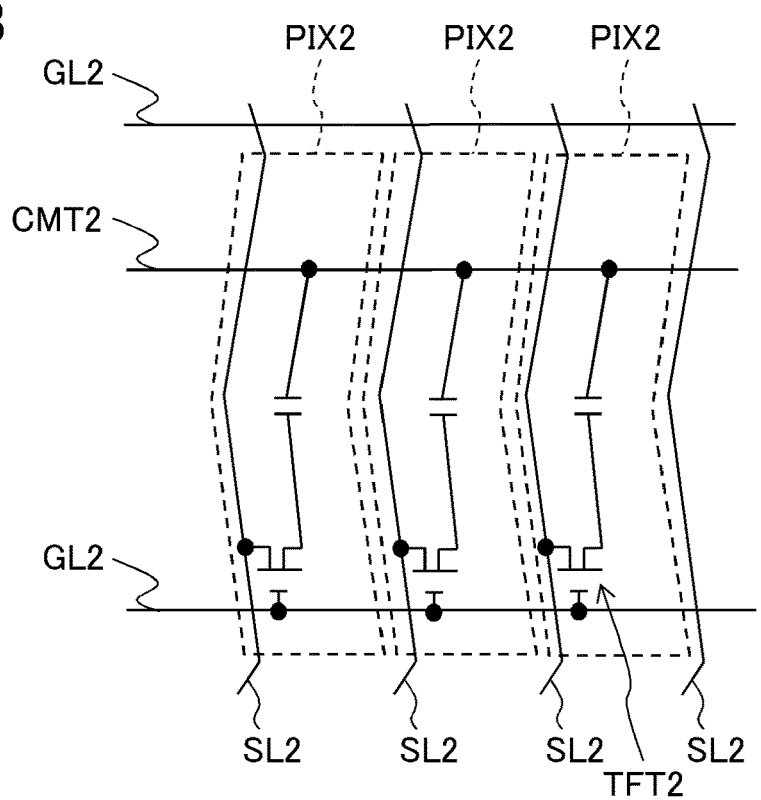

FIGS. 6A and 6B are plan views each illustrating a disposition relationship between pixel PIX1 of display panel LCP1 and pixel PIX2 of display panel LCP2. Liquid crystal display device LCD is configured such that a number of pixels PIX1 (a number of pixel electrodes PIX1) per unit area of display panel LCP1 is equal to a number of pixels PIX2 (a number of pixel electrodes PIX2) per unit area of display panel LCP2. An area of one pixel PIX1 is equal to an area of one pixel PIX2.

Figure 7:
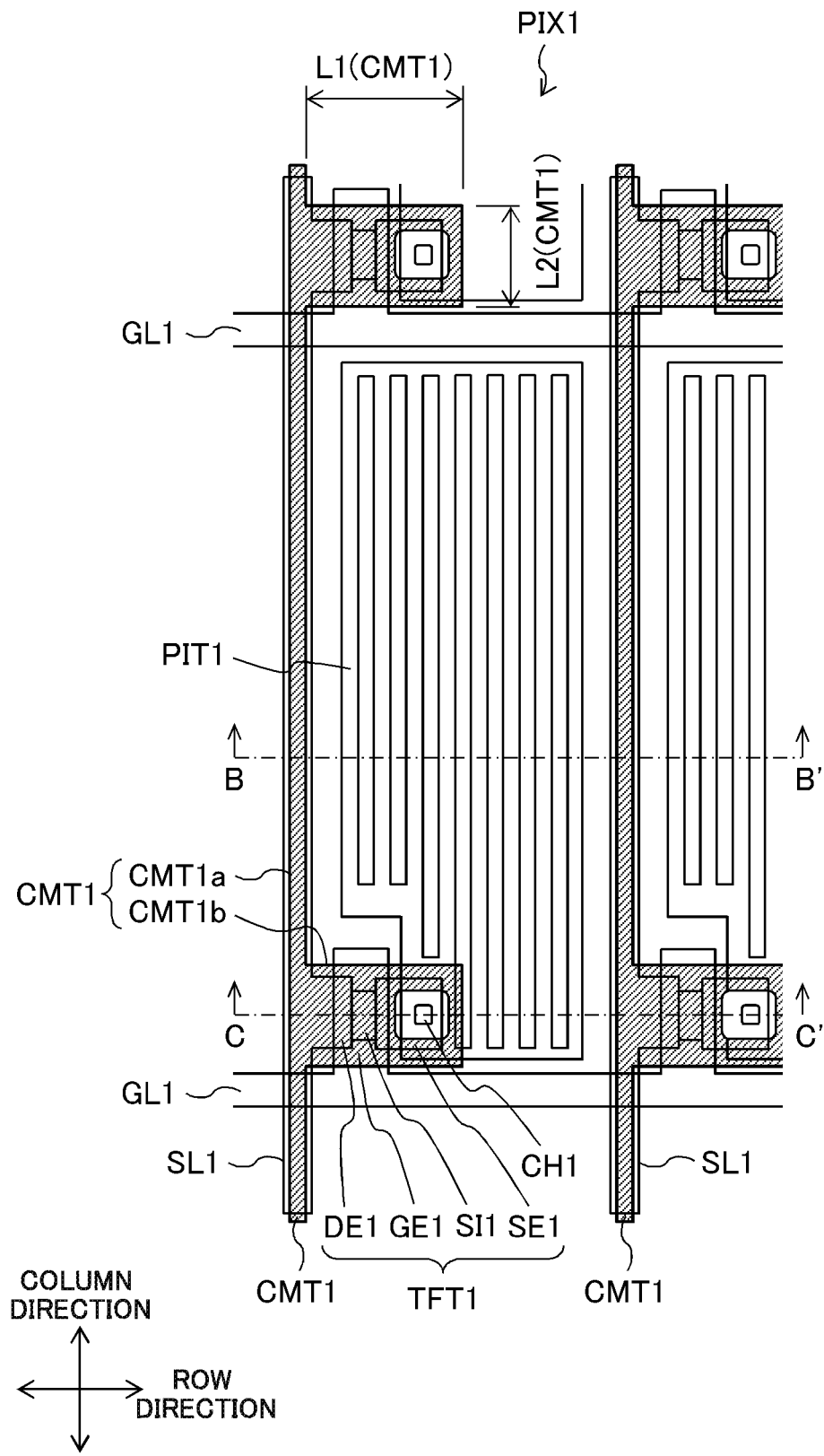
FIG. 7 is a plan view illustrating a configuration of pixel of display panel LCP1.
Figure 8:
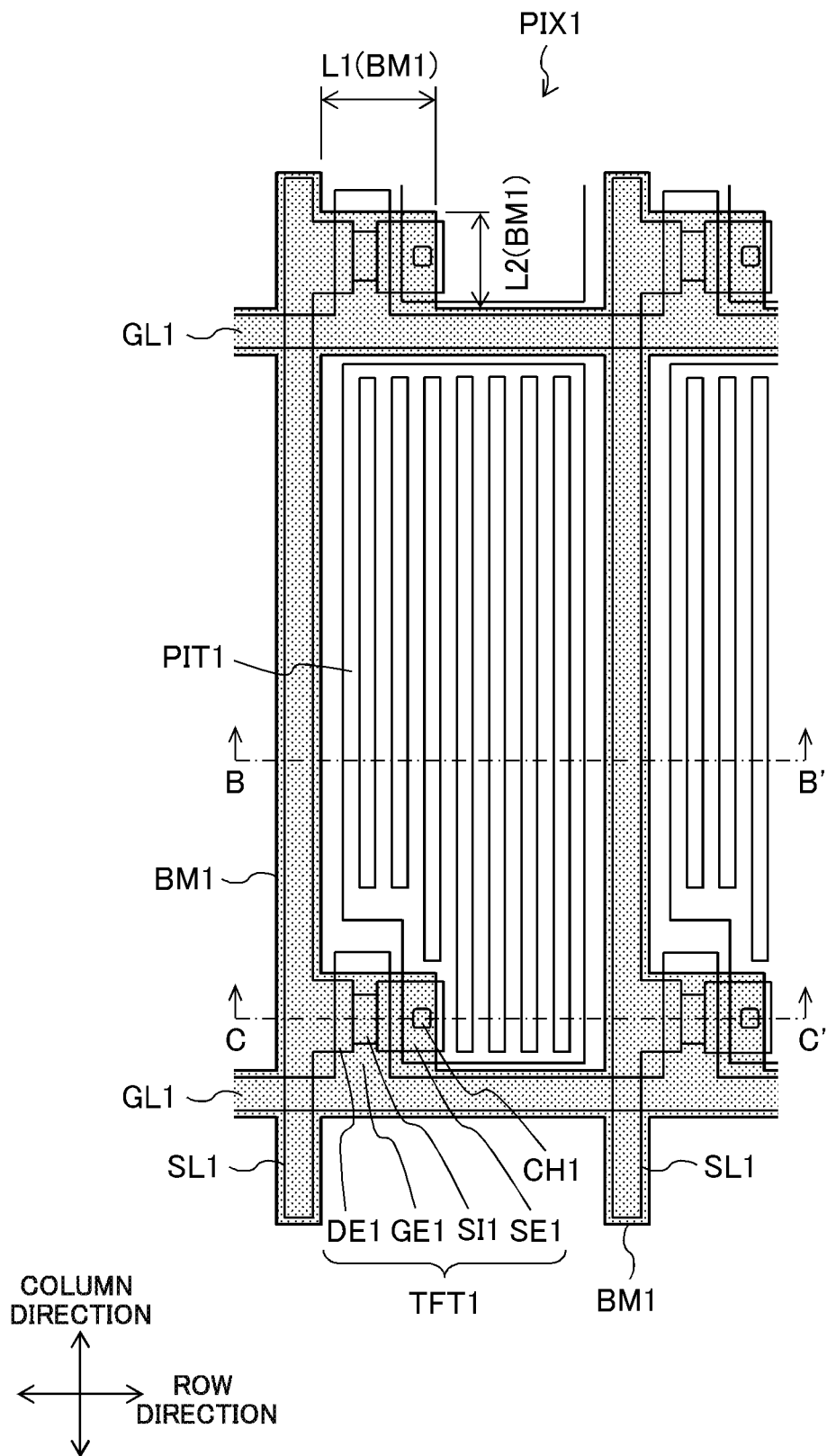
FIG. 8 is a plan view illustrating a configuration of pixel of display panel LCP1.

Each of FIGS. 7 and 8 is a plan view illustrating a configuration of pixel PIX1 of display panel LCP1. FIG. 7 illustrates a state in which counter substrate CF1 is seen through, and FIG. 8 illustrates thin film transistor substrate TFTB1 while black matrix BM1 of counter substrate CF1 overlaps thin film transistor substrate TFTB1.

As illustrated in FIG. 7, in thin film transistor TFT1, drain electrode DE1 is electrically connected to source line SL1, a part of drain electrode DE1 overlaps semiconductor layer SI1, source electrode SE1 is electrically connected to pixel electrode PIT1 through contact hole CH1, and a part of source electrode SE1 overlaps semiconductor layer SI1. Gate electrode GE1 is electrically connected to gate line GL1, and a part of gate electrode GE1 overlaps semiconductor layer SI1. Common wiring CMT1 (a half tone portion in FIG. 7) includes a portion (first portion CMT1a) extending in the column direction and a portion (second portion CMT1b) extending in the row direction, first portion CMT1a overlaps source line SL1 in planar view, and second portion CMT1b overlaps at least a part of the channel region of thin film transistor TFT1 in planar view. Second portion CMT1b may overlap the whole channel region of thin film transistor TFT1 or the whole region where thin film transistor TFT1 is formed in planar view. Common wiring CMT1 is made of a metallic material (such as copper (Cu), molybdenum (Mo), and aluminum (Al)), and electrically connected to common electrode CIT1. First portion CMT1a and second portion CMT1b may integrally be formed, or separately be formed while electrically connected to each other.

As illustrated in FIG. 8, in black matrix BM1 (a half tone portion in FIG. 8), a portion extending in the column direction overlaps source line SL1 in planar view, and a portion extending in the row direction overlaps gate line GL1 in planar view. A part of black matrix BM1 overlaps a part of the channel region of thin film transistor TFT1 in planar view. Lengths L1(CMT1), L2(CMT1) (see FIG. 7) of common wiring CMT1 (second portion CMT1b) overlapping the channel region of thin film transistor TFT1 are larger than lengths L1(BM1), L2(BM1) (see FIG. 8) of black matrix BM1 overlapping the channel region of thin film transistor TFT1, respectively. That is, second portion CMT1b includes an overlapping region where second portion CMT1b overlaps black matrix BM1 and a non-overlapping region where second portion CMT1b does not overlap black matrix BM1.

Figure 9:
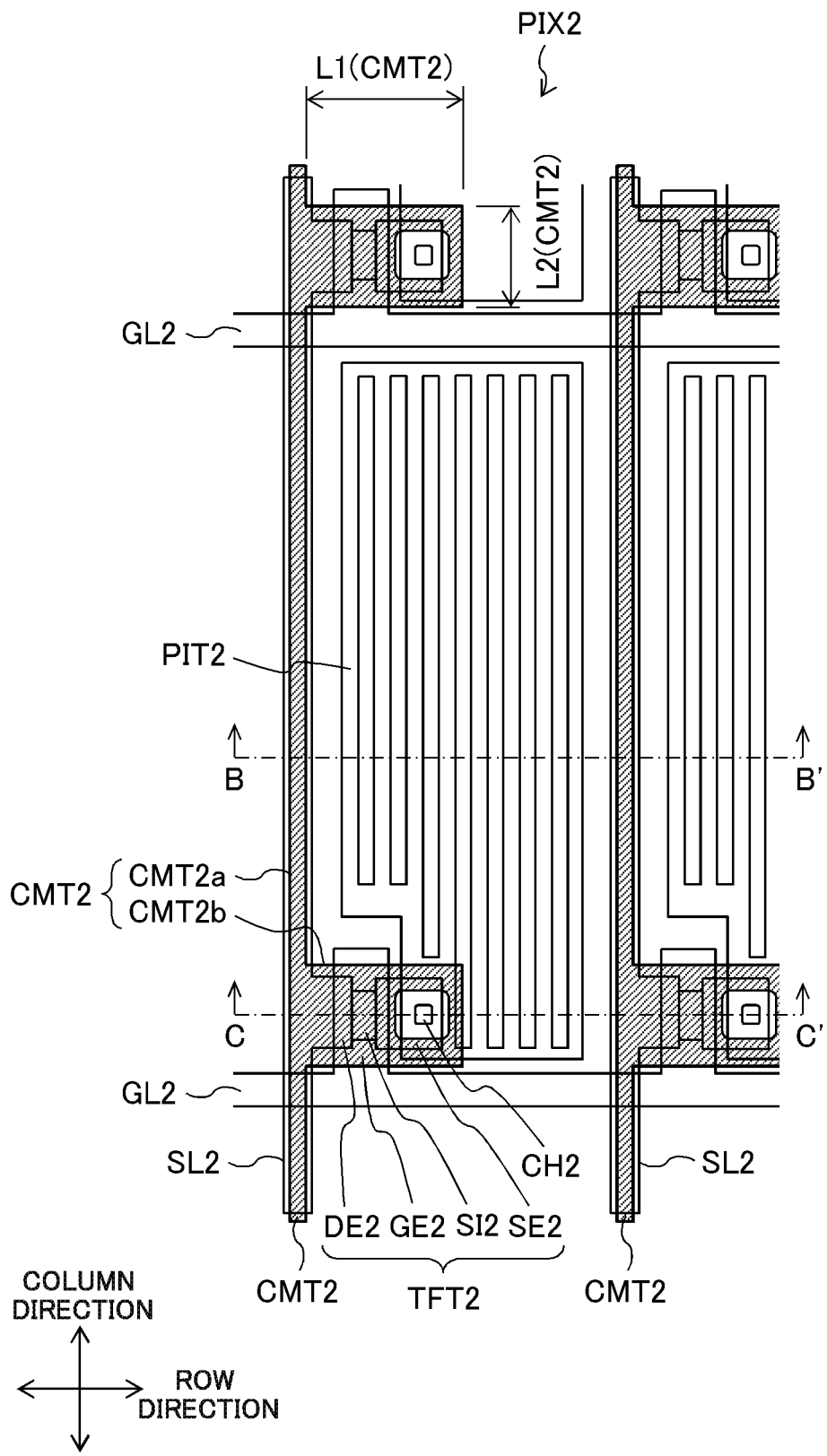
FIG. 9 is a plan view illustrating a configuration of pixel of display panel LCP2.
Figure 10:
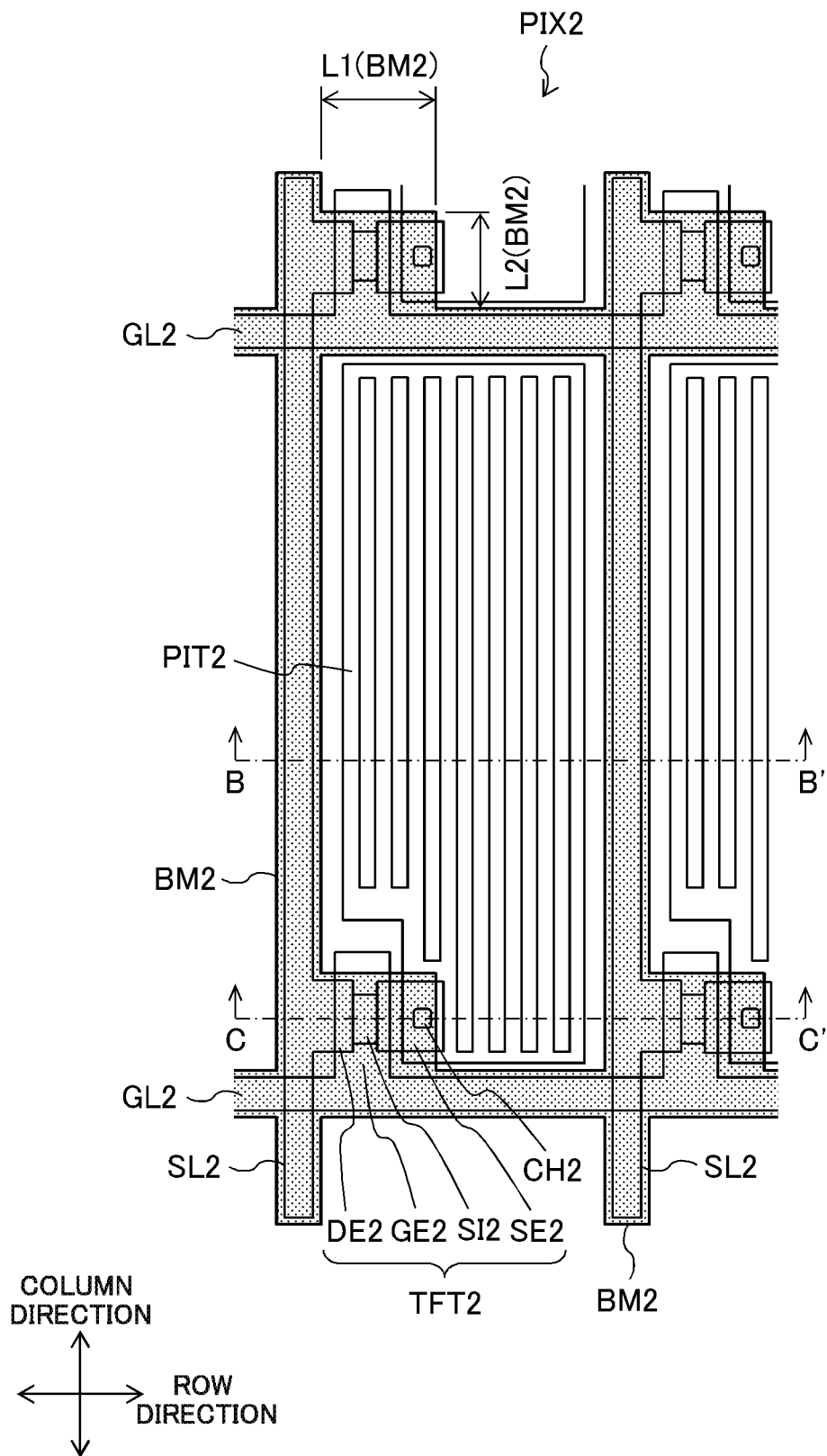
FIG. 10 is a plan view illustrating a configuration of pixel of display panel LCP2.

Each of FIGS. 9 and 10 is a plan view illustrating a configuration of pixel PIX2 of display panel LCP2. FIG. 9 illustrates a state in which counter substrate CF2 is seen through, and FIG. 10 illustrates thin film transistor substrate TFTB2 while black matrix BM2 of counter substrate CF2 overlaps thin film transistor substrate TFTB2.

As illustrated in FIG. 9, in thin film transistor TFT2, drain electrode DE2 is electrically connected to source line SL2, a part of drain electrode DE2 overlaps semiconductor layer SI2, source electrode SE2 is electrically connected to pixel electrode PIT2 through contact hole CH2, and a part of source electrode SE2 overlaps semiconductor layer SI2. Gate electrode GE2 is electrically connected to gate line GL2, and a part of gate electrode GE2 overlaps semiconductor layer SI2. Common wiring CMT2 (a half tone portion in FIG. 9) includes a portion (first portion CMT2a) extending in the column direction and a portion (second portion CMT2b) extending in the row direction, first portion CMT2a overlaps source line SL2 in planar view, and second portion CMT2b overlaps at least a part of the channel region of thin film transistor TFT2 in planar view. Second portion CMT2b may overlap the whole channel region of thin film transistor TFT2 or the whole region where thin film transistor TFT2 is formed in planar view. Common wiring CMT2 is made of a metallic material (such as copper (Cu), molybdenum (Mo), and aluminum (Al)), and electrically connected to common electrode CIT2. First portion CMT2a and second portion CMT2b may integrally be formed, or separately be formed while electrically connected to each other.

As illustrated in FIG. 10, in black matrix BM2 (a half tone portion in FIG. 10), a portion extending in the column direction overlaps source line SL2 in planar view, and a portion extending in the row direction overlaps gate line GL2 in planar view. A part of black matrix BM2 overlaps a part of the channel region of thin film transistor TFT2 in planar view. Lengths L1(CMT2), L2(CMT2) (see FIG. 9) of common wiring CMT2 (second portion CMT2b) overlapping the channel region of thin film transistor TFT2 are larger than lengths L1(BM2), L2(BM2) (see FIG. 10) of black matrix BM2 overlapping the channel region of thin film transistor TFT2, respectively. That is, second portion CMT2b includes an overlapping region where second portion CMT2b overlaps black matrix BM2 and a non-overlapping region where second portion CMT2b does not overlap black matrix BM2.

Figure 11:
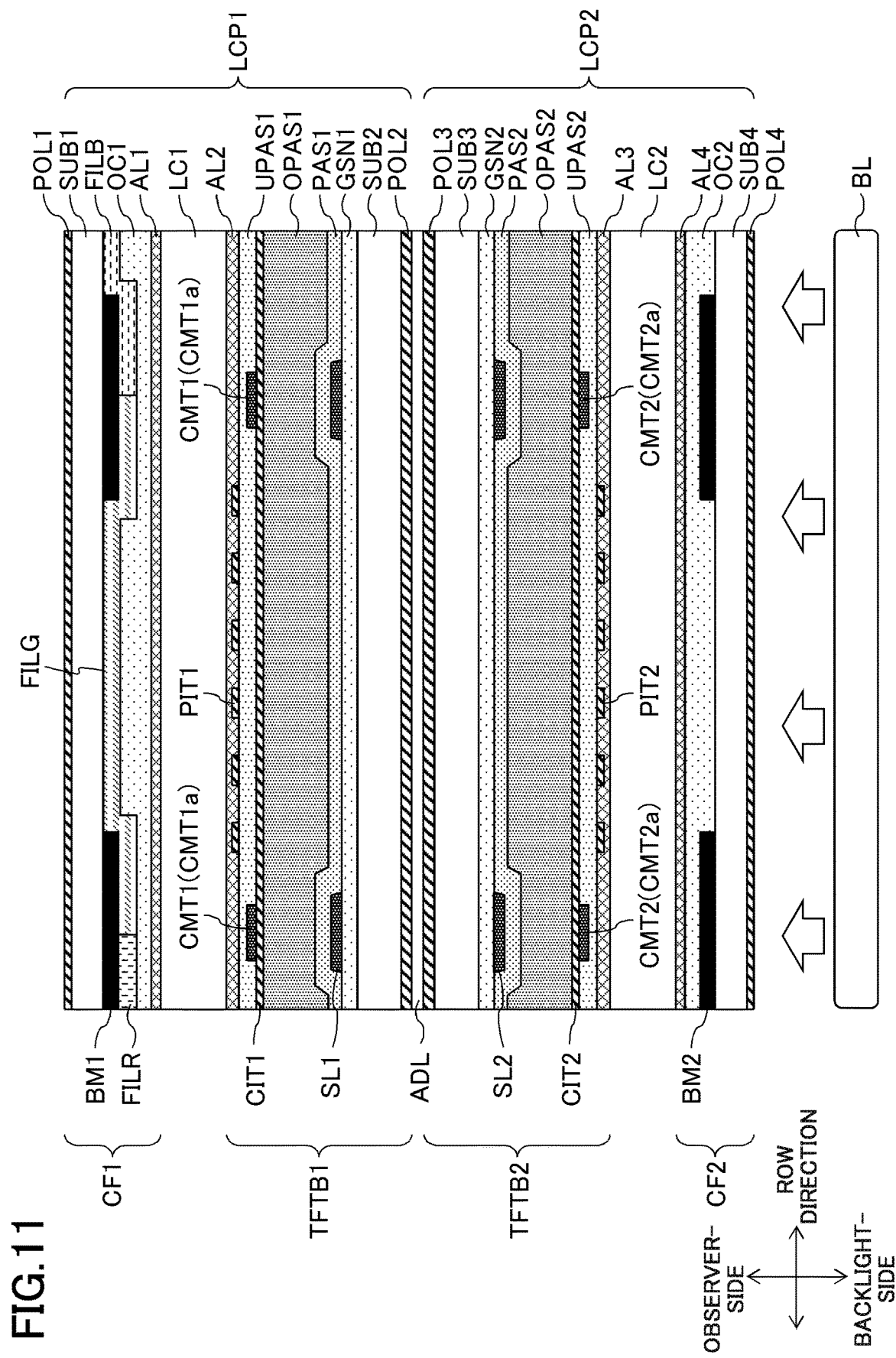
FIG. 11 is a sectional view taken along line B-B' in FIGS. 7 to 10.
Figure 12:
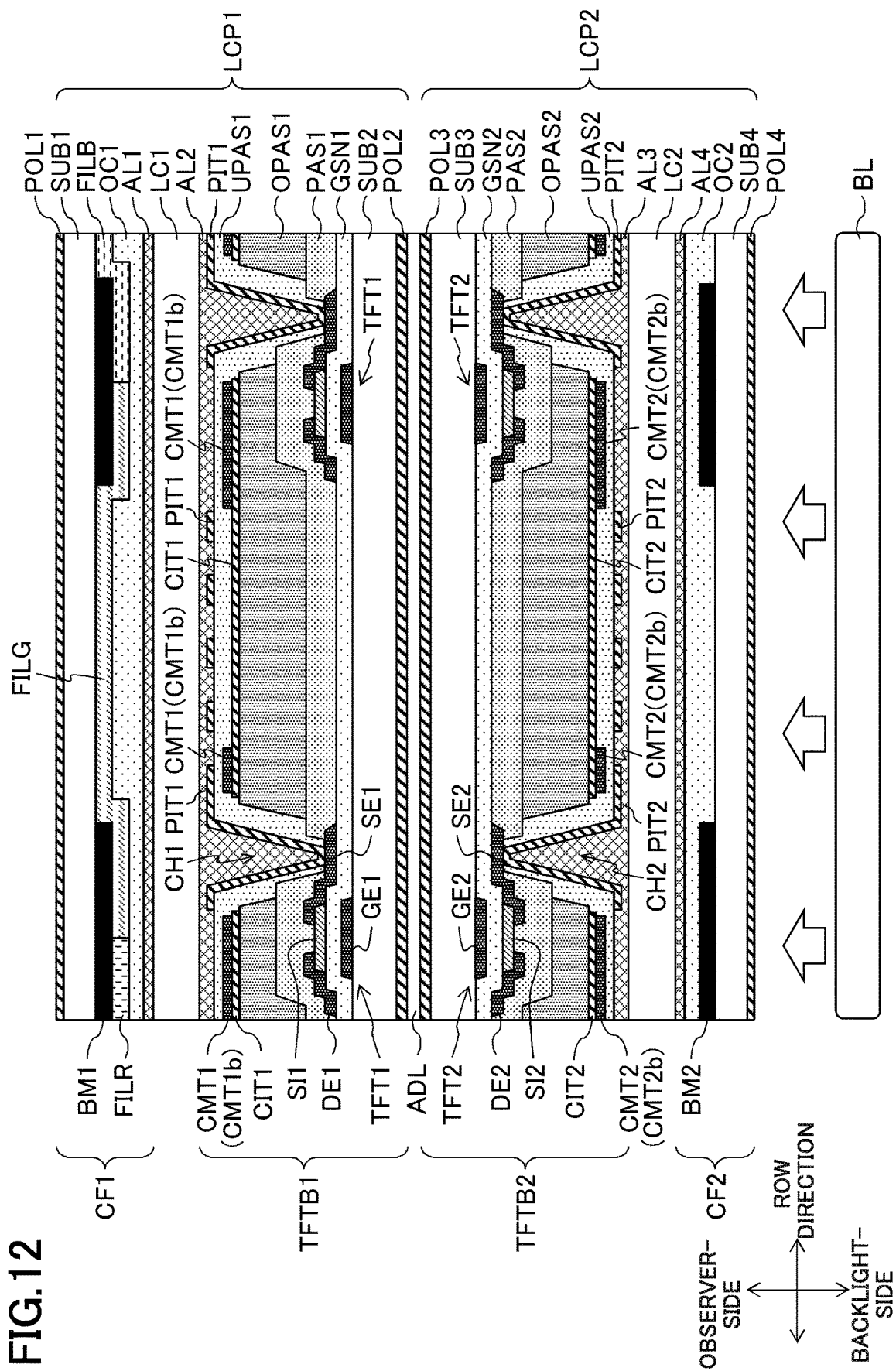
FIG. 12 is a sectional view taken along line C-C' in FIGS. 7 to 10.

FIG. 11 is a sectional view taken along line B-B' in FIGS. 7 to 10, and FIG. 12 is a sectional view taken along line C-C' in FIGS. 7 to 10. Sectional structures of pixels PIX1, PIX2 will be described below with reference to FIGS. 11 and 12. In display panel LCP1, thin film transistor substrate TFTB1 is disposed on the side of backlight BL, and counter substrate CF1 is disposed on the observer side. In display panel LCP2, thin film transistor substrate TFTB2 is disposed on the observer side, and counter substrate CF2 is disposed on the side of backlight BL. That is, thin film transistor substrate TFTB1 and thin film transistor substrate TFTB2 are disposed opposite to each other.

In thin film transistor substrate TFTB1 constituting pixel PIX1 of display panel LCP1, gate line GL1 and gate electrode GE1 are formed on transparent substrate SUB2 (glass substrate), and gate insulator film GSN1 is formed so as to cover gate line GL1 and gate electrode GE1. Source line SL1, drain electrode DE1, source electrode SE1, and semiconductor layer SI1 are formed on gate insulator film GSN1, and protective insulator film PAS1 (inorganic insulator film) and organic insulator film OPAS1 are sequentially formed so as to cover source line SL1, drain electrode DE1, source electrode SE1, and semiconductor layer SI1. Common electrode CIT1 is formed on organic insulator film OPAS1, and common wiring CMT1 is formed on common electrode CIT1. First portion CMT1a (see FIG. 11) of common wiring CMT1 overlaps source line SL1 in planar view, and second portion CMT1b (see FIG. 12) of common wiring CMT1 overlaps the region where thin film transistor TFT1 is formed in planar view. Upper insulator film UPAS1 is form so as to cover common electrode CIT1 and common wiring CMT1, pixel electrode PIT1 is formed on upper insulator film UPAS1, and alignment film AL2 is formed so as to cover pixel electrode PIT1. Protective insulator film PAS1, organic insulator film OPAS1, common electrode CIT1, common wiring CMT1 (second portion CMT1b), and upper insulator film UPAS1 are partially bored to make contact hole CH1. A part of pixel electrode PIT1 is electrically connected to source electrode SE1 through contact hole CH1.

In counter substrate CF1, black matrix BM1 and color filter FIL (red color filter FILR, green color filter FILG, and blue color filter FILB) are formed on transparent substrate SUB1 (glass substrate). Overcoat film OC1 is coated on a surface of color filter FIL, and alignment film AL1 is formed on overcoat film OC1.

In thin film transistor substrate TFTB2 constituting pixel PIX2 of display panel LCP2, gate line GL2 and gate electrode GE2 are formed on transparent substrate SUB3 (glass substrate), and gate insulator film GSN2 is formed so as to cover gate line GL2 and gate electrode GE2. Source line SL2, drain electrode DE2, source electrode SE2, and semiconductor layer SI2 are formed on gate insulator film GSN2, and protective insulator film PAS2 and organic insulator film OPAS2 are sequentially formed so as to cover source line SL2, drain electrode DE2, source electrode SE2, and semiconductor layer SI2. Common electrode CIT2 is formed on organic insulator film OPAS2, and common wiring CMT2 is formed on common electrode CIT2. First portion CMT2a (see FIG. 11) of common wiring CMT2 overlaps source line SL2 in planar view, and second portion CMT2b (see FIG. 12) of common wiring CMT2 overlaps the region where thin film transistor TFT2 is formed in planar view. Upper insulator film UPAS2 is form so as to cover common electrode CIT2 and common wiring CMT2, pixel electrode PIT2 is formed on upper insulator film UPAS2, and alignment film AL3 is formed so as to cover pixel electrode PIT2. Protective insulator film PAS2, organic insulator film OPAS2, common electrode CIT2, common wiring CMT2 (second portion CMT2b), and upper insulator film UPAS2 are partially bored to make contact hole CH2. A part of pixel electrode PIT2 is electrically connected to source electrode SE2 through contact hole CH2.

In counter substrate CF2, lattice-shape black matrix BM2 is formed on transparent substrate SUB4 (glass substrate), an opening (light transmission unit) of black matrix BM2 and black matrix BM2 are coated with overcoat film OC2, and alignment film AL4 is formed on overcoat film OC2.

In liquid crystal display device LCD of the first exemplary embodiment, second portion CMT2b of display panel LCP2 is disposed so as to overlap the channel region of thin film transistor TFT2 in planar view, so that an amount of light incident on the channel region can be decreased. In the region overlapping the channel region, an area of second portion CMT2b is larger than an area of black matrix BM2, and second portion CMT2b is disposed close to the channel region, so that second portion CMT2b can shield the light that is not completely shielded by black matrix BM. Second portion CMT2b is disposed between thin film transistor TFT2 and backlight BL, so that second portion CMT2b can shield the light incident on the channel region from backlight BL. Because second portion CMT2b has the function of shielding the light of the black matrix BM, a width of black matrix BM2 can be decreased, and an influence due to misalignment between thin film transistor substrate TFTB2 and counter substrate CF2 can be decreased. Second portion CMT2b is integral with common wiring CMT2, and formed through the same process as common wiring CMT2, so that the manufacturing process does not become complicated.

Second portion CMT1b of display panel LCP1 has an effect similar to that of second portion CMT2b of display panel LCP1. In display panel LCP1, second portion CMT1b is disposed on the observer side with respect to thin film transistor TFT2, so that second portion CMT1b can shield the light incident on the channel region from the natural light.

Thus, second portion CMT1b and second portion CMT2b act as a light shielding unit that shields the light incident on the channel region of the thin film transistor. Consequently, a characteristic change of the thin film transistor due to the light incidence is prevented, so that the degradation of the display quality can be prevented.

Figure 13:
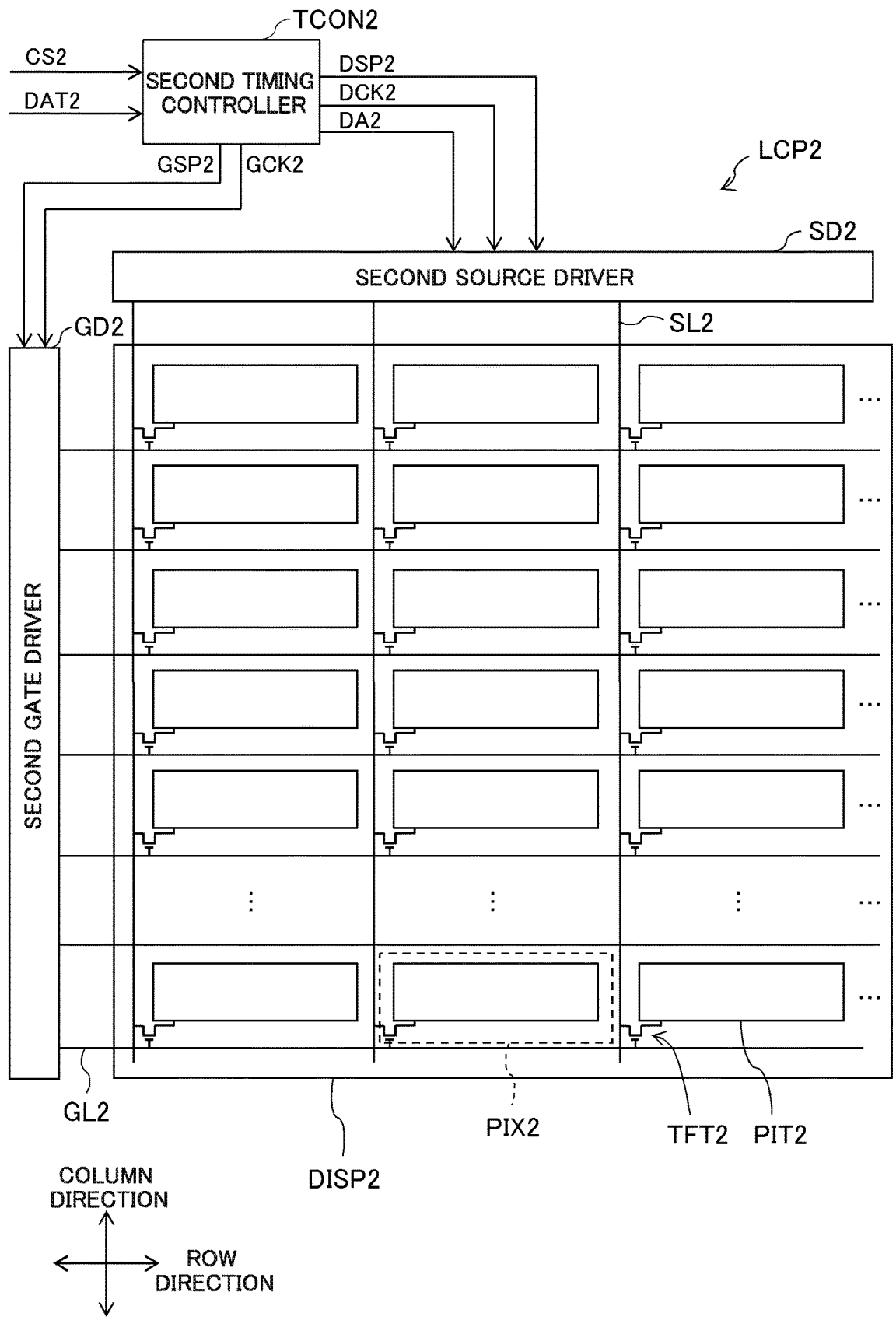
FIG. 13 is a plan view illustrating another configuration of pixel of display panel LCP2 of the first exemplary embodiment.
Figure 14A:
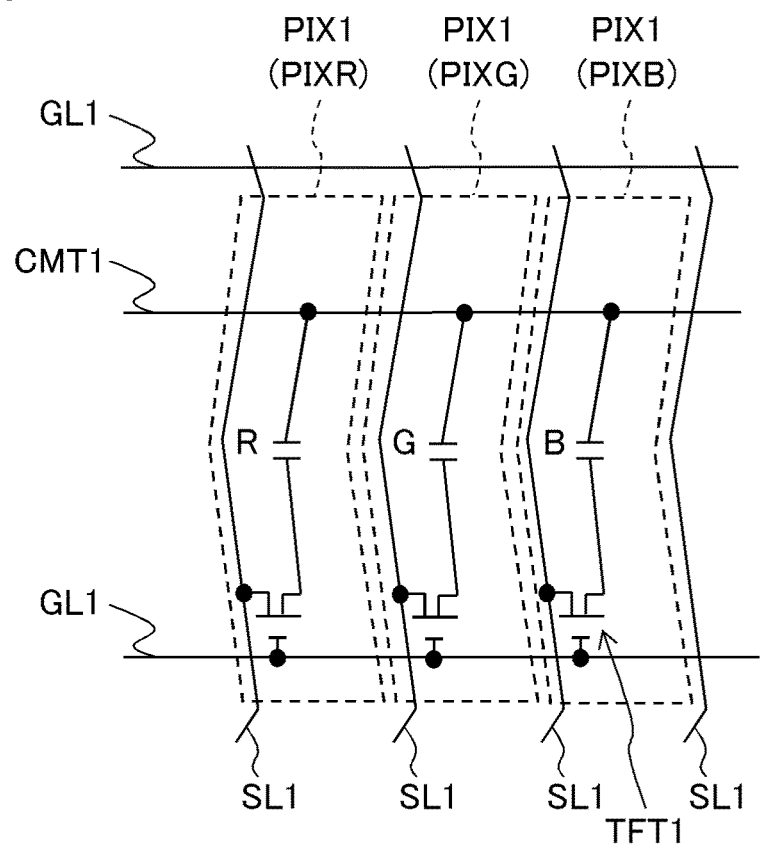
FIGS. 14A and 14B are plan views each illustrating a disposition relationship between pixel of display panel LCP1 and pixel of display panel LCP2 of the first exemplary embodiment.
Figure 14B:
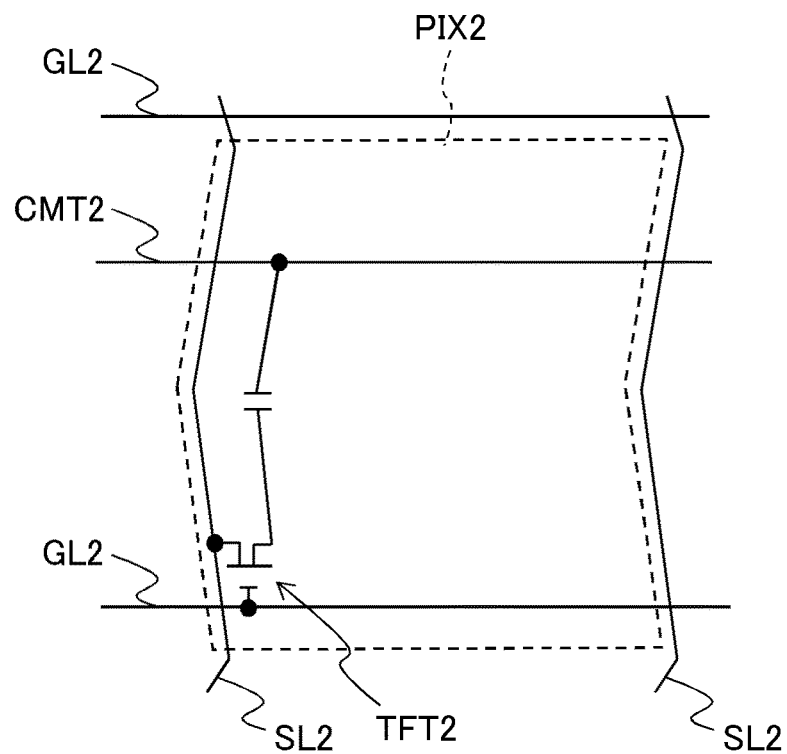

Liquid crystal display device LCD of the first exemplary embodiment is not limited to the above configuration. For example, as illustrated in FIGS. 3, 13, and 14, liquid crystal display device LCD of the first exemplary embodiment may be configured such that a number of pixels PIX2 (a number of pixel electrodes PIT2) per unit area of display panel LCP2 is smaller than a number of pixels PIX1 (a number of pixel electrodes PIT1) per unit area of display panel LCP1. Specifically, in the configuration of FIGS. 14A and 14B, pixels PIX1 of display panel LCP1 and pixels PIX2 of display panel LCP2 are disposed such that a ratio of the number of pixels PIX1 to the number of pixels PIX2 is 3:1. Three pixels PIX1 (red pixel PIXR, green pixel PIXG, and blue pixel PIXB) of display panel LCP1 and one pixel PIX2 of display panel LCP2 are disposed so as to overlap each other in planar view.

In liquid crystal display device LCD, display panel LCP1 may be disposed on the side of backlight BL, and display panel LCP2 may be disposed on the observer side.

In the display panel (display panel LCP1 in FIG. 12 and the like) disposed on the observer side, second portion CMT1b may be eliminated in common wiring CMT1. Thus, in liquid crystal display device LCD of the first exemplary embodiment, it is only necessary to provide second portion CMT2b in at least the display panel (display panel LCP2 in FIG. 12 and the like) disposed on the side of backlight BL.

Therefore, at least the light from backlight BL having the largest light amount can be shielded.

Second Exemplary Embodiment

Liquid crystal display device LCD according to a second exemplary embodiment is constructed with display panel LCP1 (see FIG. 3) of the first exemplary embodiment while display panel LCP2 of liquid crystal display device LCD of the first exemplary embodiment is eliminated. FIG. 15 is a sectional view illustrating display panel LCP of the second exemplary embodiment. FIG. 15 illustrates the sectional portion taken along line B-B' in FIGS. 7 and 8. In display panel LCP of the second exemplary embodiment, thin film transistor substrate TFTB is disposed on the side of backlight BL, and counter substrate CF is disposed on the observer side. Second portion CMTb of common wiring CMT overlaps at least a part of the channel region of thin film transistor TFT in planar view. Second portion CMTb may overlap the whole channel region of thin film transistor TFT or the whole region where thin film transistor TFT is formed in planar view. Consequently, the light incident on the channel region of thin film transistor TFT from the natural light can be shielded.

Figure 16:
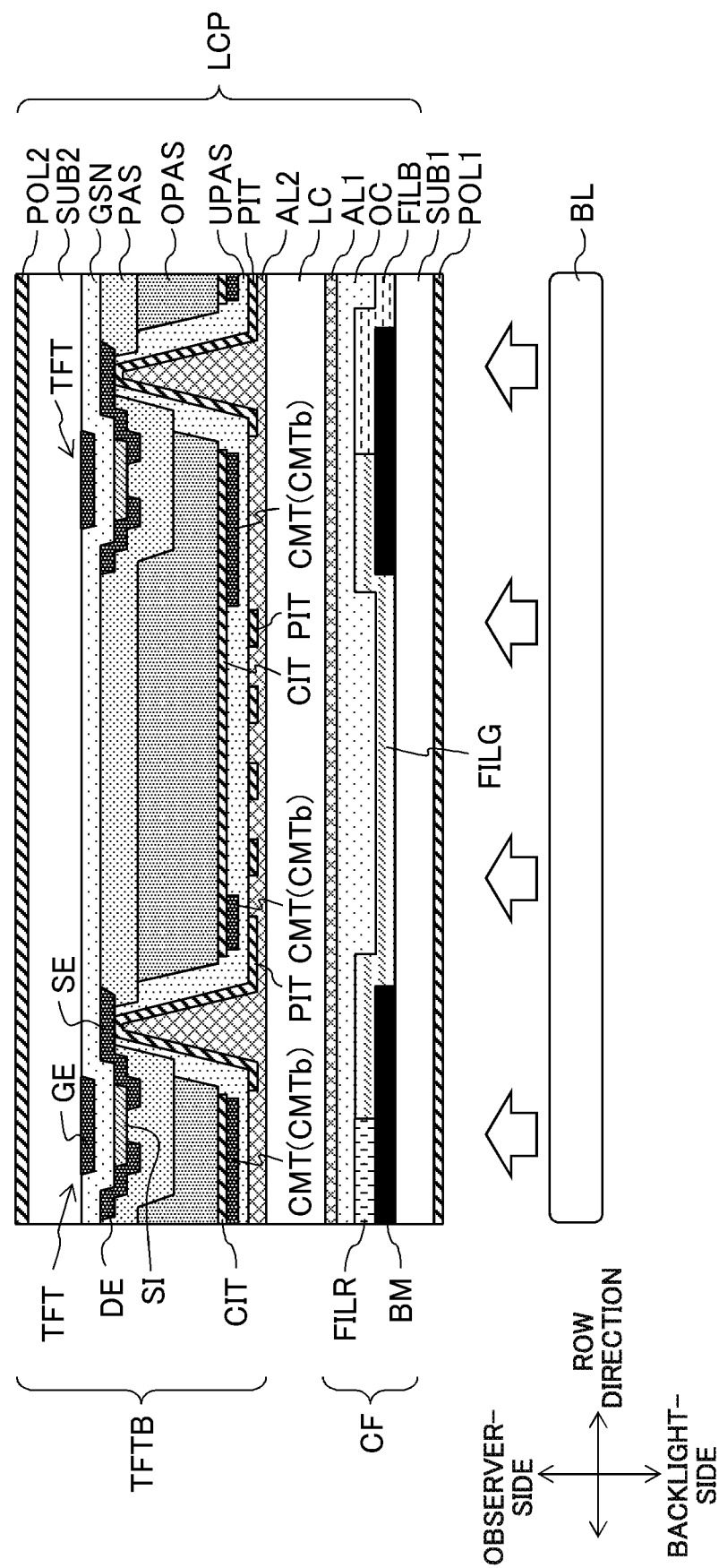
FIG. 16 is a sectional view illustrating another configuration of pixel of display panel LCP of the second exemplary embodiment.

Liquid crystal display device LCD of the second exemplary embodiment is not limited to the above configuration. For example, as illustrated in FIG. 16, thin film transistor substrate TFTB may be disposed on the observer side, and counter substrate CF may be disposed on the side of backlight BL. In the configuration of FIG. 16, second portion CMTb is disposed between thin film transistor TFT and backlight BL and close to the channel region, so that the light incident on the channel region from backlight BL can be shielded.

The configuration of the pixel in liquid crystal display device LCD of the present disclosure is not limited to the configurations of the first and second exemplary embodiments. For example, in the first and second exemplary embodiments, the thin film transistor may be made of amorphous silicon (a-Si) or oxide semiconductor.

In the first and second exemplary embodiments, the light shielding unit (second portions CMT1b, CMT2b, CMTb) overlapping the channel region of thin film transistor TFT may be disposed in the floating state while electrically separated from the common electrode (CIT1, CIT2, CIT).

Figure 17:
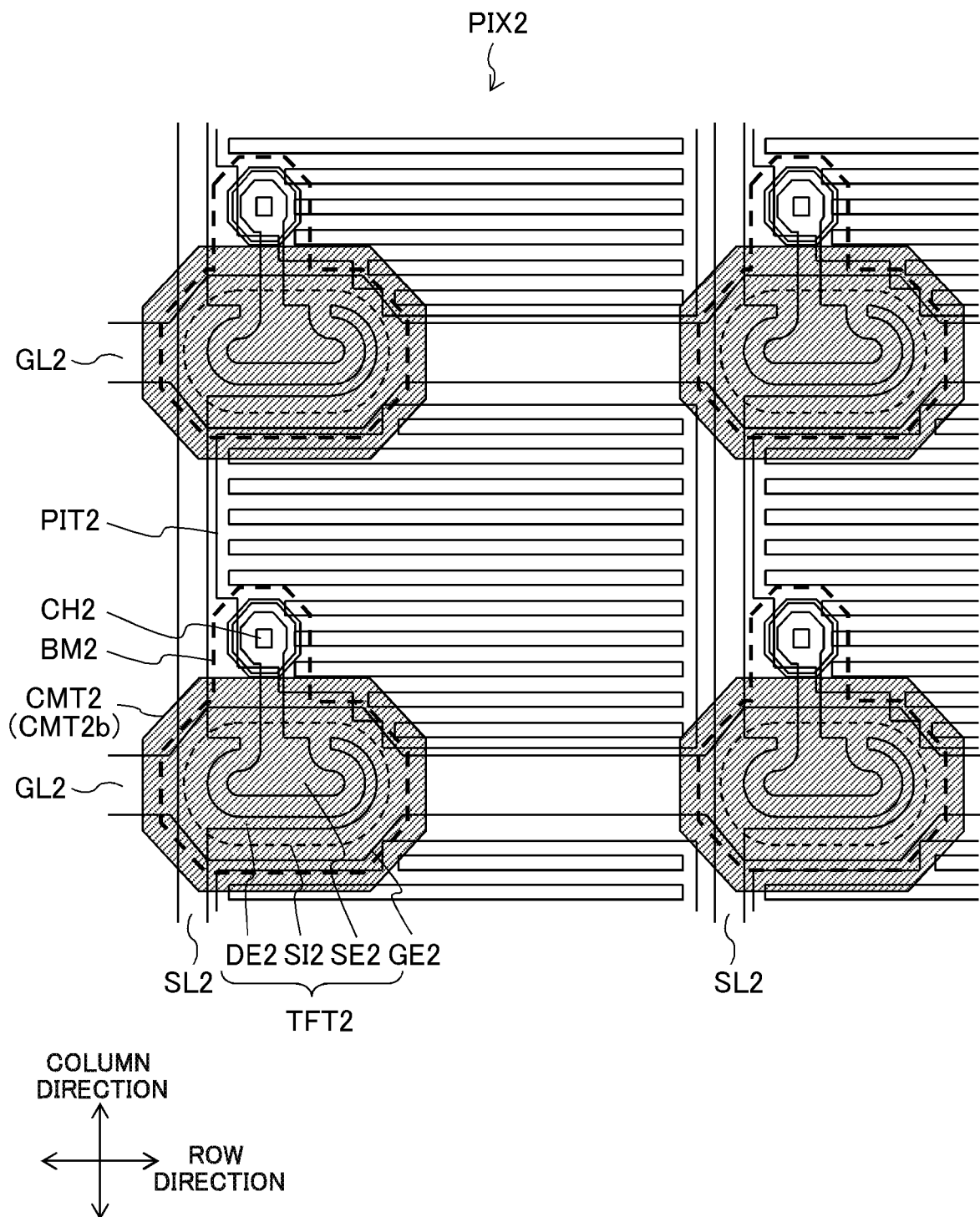
FIG. 17 is a plan view illustrating another pixel configuration of display panel of the first exemplary embodiment.

FIG. 17 is a plan view illustrating another pixel configuration of display panel LCP2 of the first exemplary embodiment. As illustrated in FIG. 17, second portion CMT2b (light shielding unit) is disposed so as to overlap the channel region of thin film transistor TFT2 in planar view. Second portion CMT2b may be integral with first portion CMT2a of common wiring CMT2, or formed in the floating state. Second portion CMT2 (a hatched portion in FIG. 17) is larger than black matrix BM2 (a bold dotted-line portion in FIG. 17) in an area. Contact hole CH2 may be made outside the region of second portion CMT2 in planar view. The configuration of the pixel in FIG. 17 can also be applied to display panel LCP1 of the first exemplary embodiment and display panel LCP of the second exemplary embodiment.

Although exemplary embodiments of the present disclosure are described above, the present disclosure is not limited to these exemplary embodiments. It is noted that exemplary embodiments properly changed from the exemplary embodiments described above by those skilled in the art without departing from the scope of the present disclosure are included in the present disclosure.

What is claimed is:

1. A liquid crystal display device comprising:
   a first substrate formed with a first gate line, a first source line, a first thin film transistor, and a first light shielding unit;
   a second substrate disposed opposite to the first substrate;
   a first liquid crystal layer disposed between the first substrate and the second substrate;
   a third substrate formed with a second gate line, a second source line, and a second thin film transistor;
   a fourth substrate disposed opposite to the third substrate; and
   a second liquid crystal layer disposed between the third substrate and the fourth substrate, wherein
   the first substrate and the third substrate are disposed between the first liquid crystal layer and the second liquid crystal layer, and
   the first light shielding unit is disposed between the first thin film transistor and the first liquid crystal layer, the first light shielding unit having a first portion extending along the first source line and a second portion extending along the first gate line, and the second portion overlapping at least a part of a first channel region of the first thin film transistor in planar view.

2. The liquid crystal display device according to claim 1, further comprising:
   a common electrode formed on the first substrate, the common electrode being present in a pixel region,
   wherein the first light shielding unit is made of a metallic material, and electrically connected to the common electrode.

3. The liquid crystal display device according to claim 2, wherein
   a common wiring through which a common voltage is supplied to the common electrode is further formed on the first substrate, and
   the first light shielding unit is integral with the common wiring.

4. The liquid crystal display device according to claim 1, wherein
   an organic insulator film is further formed on the first substrate, and
   the organic insulator film is disposed between the first thin film transistor and the first light shielding unit.

5. The liquid crystal display device according to claim 1, further comprising:
   a backlight, wherein the first liquid crystal layer is disposed between the backlight and the first substrate.

6. The liquid crystal display device according to claim 1, wherein
   the second substrate includes a black matrix,
   the black matrix overlaps at least a part of the first channel region in planar view, and
   the first light shielding unit includes an overlapping region where the first light shielding unit overlaps the black matrix and a non-overlapping region where the first light shielding unit does not overlap the black matrix.

7. The liquid crystal display device according to claim 1, further comprising:
   a backlight, wherein the first liquid crystal layer is disposed between the backlight and the second substrate.

8. The liquid crystal display device according to claim 1, wherein
   a second light shielding unit is further formed on the third substrate, and the second light shielding unit is disposed between the second thin film transistor and the second liquid crystal layer, and overlaps at least a part of a second channel region of the second thin film transistor in planar view.

* * * * *